United States Patent [19]
Dormer et al.

[11] Patent Number: 6,117,794
[45] Date of Patent: Sep. 12, 2000

[54] METHOD FOR IMPROVED METAL OXIDE BONDING OF OPTICAL ELEMENTS

[75] Inventors: James F. Dormer, Limekiln; John William Osenbach, Kutztown; Marilyn Markey Ecker, Shillington, all of Pa.

[73] Assignee: Lucent Technologies, Inc., Murray Hill, N.J.

[21] Appl. No.: 09/008,640

[22] Filed: Jan. 16, 1998

[51] Int. Cl.[7] .................................. H01L 21/302
[52] U.S. Cl. ....................... 438/745; 216/34; 216/35; 134/1.1; 134/1.2; 134/1.3
[58] Field of Search .................. 134/1.1, 1.2, 1.3, 134/22.19; 438/745; 257/433; 216/34, 35

[56] References Cited

U.S. PATENT DOCUMENTS

| | | | |
|---|---|---|---|
| 3,416,975 | 12/1968 | Webb et al. | 216/34 |
| 4,826,272 | 5/1989 | Pimpinella et al. | 257/98 |
| 4,904,036 | 2/1990 | Blonder | 257/116 |
| 5,312,520 | 5/1994 | Chung | 216/34 |
| 5,437,739 | 8/1995 | Hays | 216/34 |

*Primary Examiner*—Robert Kunemund
*Attorney, Agent, or Firm*—Mathews, Collins, Shepherd & Gould, P.A.

[57] ABSTRACT

A method of preparing a supporting substrate of an optical subassembly for metal-oxide bonding an optical element to the substrate. The method includes providing a supporting substrate including a metalized region for metal-oxide bonding an optical element to the substrate and rinsing the substrate in a potassium hydroxide solution. The potassium hydroxide solution removes any excess metal oxide or other contaminants from the surface of the metalized region.

7 Claims, 2 Drawing Sheets

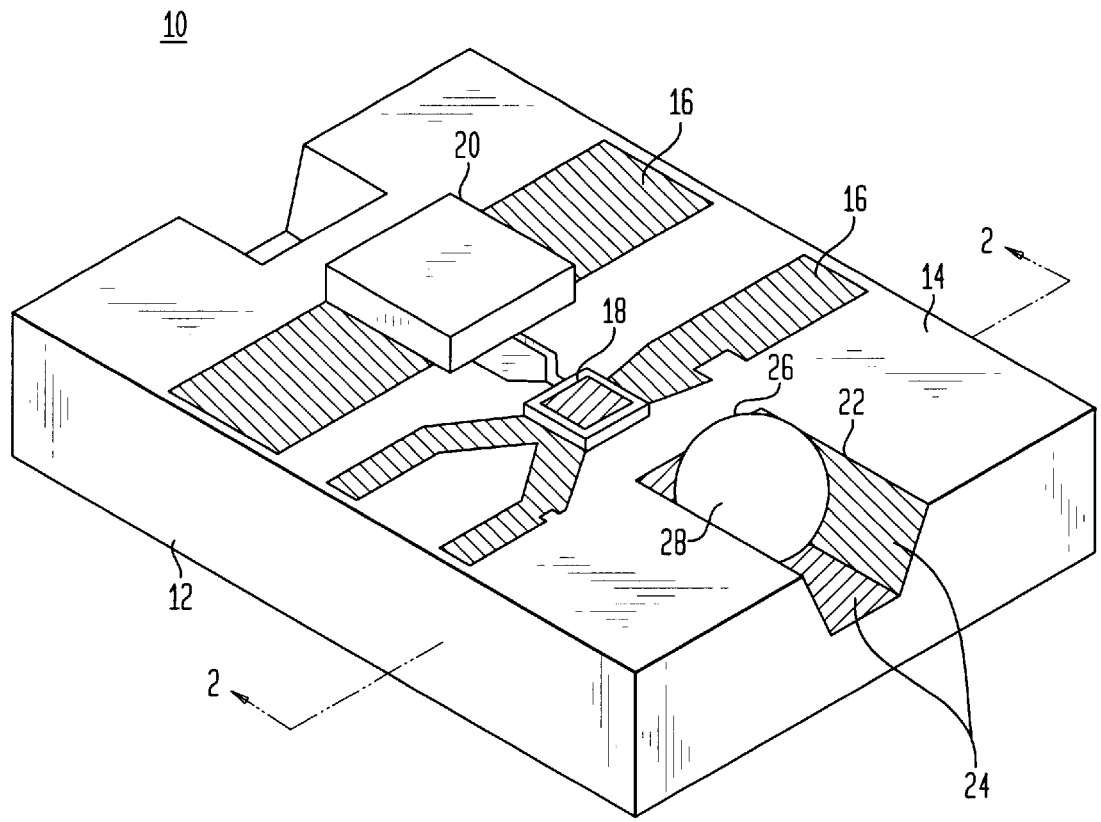
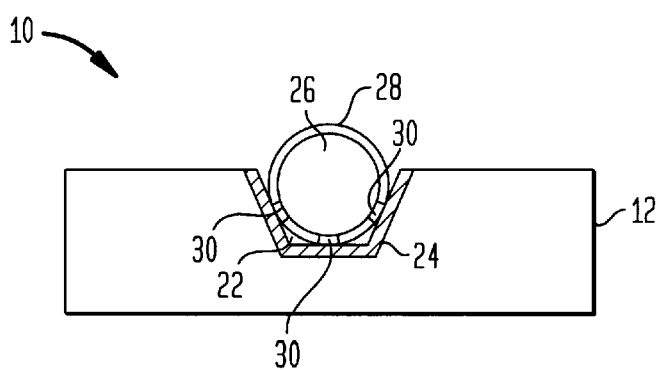
FIG. 2

METHOD FOR IMPROVED METAL OXIDE BONDING OF OPTICAL ELEMENTS

FIELD OF THE INVENTION

This invention relates to methods for bonding oxide coated optical elements to metal surfaces of optical subassemblies and, in particular, to a method for enhancing such bonding by removing excessive metal oxide growth from the metal coated surfaces.

BACKGROUND OF THE INVENTION

Optical subassemblies often include optical elements bonded to supporting substrates. Many of these supporting substrates are made from silicon and are therefore, called silicon optical benches. The optical elements are typically mounted in a retaining cavity defined in the working surface of the silicon optical bench. The retaining cavity holds each optical element in precise alignment with the other components of the subassembly. The surface of the retaining cavity may include a layer of metal such as aluminum, which is used for metal oxide bonding the optical element in the retaining cavity.

Optical components are typically bonded in position by aluminum oxide bonding. Aluminum oxide bonding involves applying heat and pressure at the interface of the optical element and the aluminum layer. The heat and pressure, in the presence of aluminum, causes a silicon dioxide layer applied to the surface of the optical element to be reduced to aluminum oxide. The aluminum oxide bonds the optical element in the cavity.

The retaining cavity, the aluminum layer and the metalized regions of the silicon optical bench are fabricated with photolithographic techniques that utilize electrolytic chemicals. These methods involve coating the silicon optical bench with layers of photoresist. The photoresist may be patterned into a mask whose shape allows the cavity, the aluminum layer and the metalized regions to be fabricated in the pattern defined by the photoresist mask. After a feature is created, the photoresist mask is removed with a photoresist stripping solution. Many layers of photoresist may be deposited, patterned and stripped during the fabrication of a typical optical subassembly. Many of these photoresist stripping solutions are electrolytic in nature.

A difficulty which is commonly arises is that unwanted electrolytic reactions on the silicon optical bench weaken the strength of the aluminum oxide bond. Since aluminum is anodic (positive voltage), relative to gold, platinum, titanium, and tin, a potential drop of approximately 2.5–3 volts across the metalizations and the aluminum layer coating the cavity have been observed when the optical benches are immersed in photoresist stripping solutions. This leads to a electrochemical reaction that significantly increases the thickness of the native aluminum oxide film already present on the aluminum surface. The native aluminum oxide films are typically 20 to 35 angstroms thick and result from exposure to air. Aluminum oxide films created by anodic oxidation of the aluminum when photoresist strippers are used typically have a thickness of about 100 angstroms. Optical elements that are aluminum oxide bonded to aluminum with native aluminum oxide films exhibit acceptable optical element shear strengths of approximately 200 grams. However, optical elements aluminum oxide bonded to aluminum with aluminum oxide films thickened by anodic oxidation of the aluminum exhibit unacceptably low optical element shear strengths of approximately 10 grams.

Accordingly, there is a need for a method of preparing or pre-treating a supporting substrate of an optical subassembly in order to substantially improve the shear strength of a metal oxide bonded optical element.

SUMMARY OF THE INVENTION

An improved method of metal-oxide bonding an optical element to the substrate comprising providing a supporting substrate having a metalized region for metal-oxide bonding an optical element to the substrate and rinsing the substrate in an etchant solution. The etchant solution is selected for removing excess metal oxide from the surface of the metalized region without adversely affecting the substrate. A preferred etchant solution includes potassium hydroxide. The optical element is then metal oxide bonded to the substrate.

BRIEF DESCRIPTION OF THE DRAWINGS

The advantages, nature and various additional features of the invention will appear more fully upon consideration of the illustrative embodiments now to be described in detail in connection with the accompanying drawings. In the drawings:

FIG. 1 is a perspective view of an optical subassembly made according to the method of the present invention;

FIG. 2 is a cross-sectional view through line 2—2 of FIG. 1; and

DETAILED DESCRIPTION OF THE INVENTION

Figure 3:
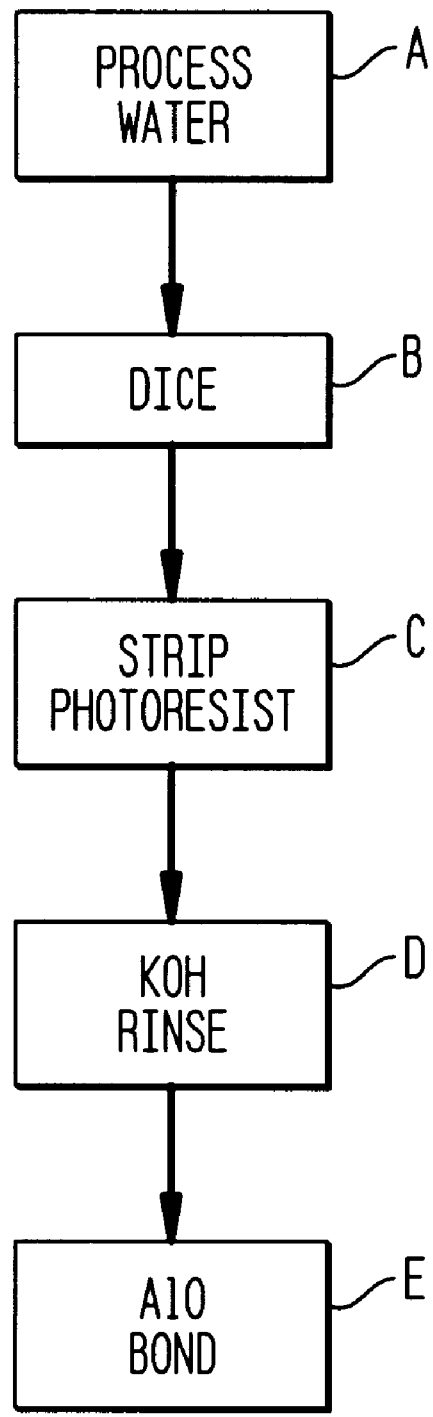
FIG. 3 is a diagram depicting the steps of the method of the present invention.

FIG. 1 is a perspective view of an exemplary optical subassembly 10, fabricated in accordance with the method of present invention. The optical subassembly 10 is widely adaptable for use in various optoelectronic devices such as optical receivers, transmitters, or transceivers. The optical subassembly 10 includes a supporting substrate 12 which is fabricated from a wafer of semiconductor or insulative material. In a preferred embodiment, the supporting substrate 12 is made from a wafer of monocrystalline silicon semiconductor material because monocrystalline silicon etches preferentially along predictable crystallographic planes in an anisotropic manner. When silicon is used as a supporting substrate in optoelectric devices, the silicon supporting substrate is referred to as a "silicon optical bench."

The supporting substrate or silicon optical bench 12 defines a working surface 14 which may include a plurality of metalized regions 16. The metalized regions 16 may each comprise a first layer of titanium, a second layer of platinum, and a third layer of gold. In other embodiments, the metalized regions 16 may include a thin layer of less than 500 angstroms of titanium nitride inserted between the platinum and titanium layers. Selected portions of the metalized regions 16 include mounting pads (not visible) comprised of gold and tin. The mounting pads respectfully attach and electrically connect a laser chip 18 and a photodiode 20 to the metalized regions 16. The working surface 14 of the optical bench 12 further includes an optical element retaining cavity 22 having a metalized region formed by a layer 24 of aluminum. The retaining cavity 22 retains an optical element 26 such as a microlens, for focusing light emitted from the laser chip 18. The optical element 26 is coated with a layer of silicon dioxide 28 and bonded to the surface of the cavity by a plurality of aluminum oxide bonds 30 (FIG. 2).

FIG. 2 is a cross-sectional view through line 2—2 of FIG. 1 showing the aluminum oxide bonds 30. The aluminum oxide bonds 30 are formed at all locations where the optical element 26 contacts the aluminum layer 24 of the cavity 22. The aluminum oxide bonds 30 are formed under heat and pressure by the reduction of the silicon dioxide layer 28, at the contact points, by the aluminum layer 24.

FIG. 3 depicts the steps used for preparing or pre-treating a supporting substrate of an optical subassembly for metal oxide bonding. The method substantially improves metal oxide bonded, optical-element shear strengths of optical subassemblies. For purposes of illustration only, the method will be described as it applies to the fabrication of the optical subassembly of FIG. 1. It should be understood, that the method can be used to fabricate other types of optical subassemblies which include metal oxide bonded optical elements. Moreover, many integrated circuits and printed circuit boards include dissimilar metals that exhibit electrochemical oxide formation. Since the oxide interferes with subsequent mechanical or electrical bonding to the metal surface, these integrated circuits and printed circuit boards may also benefit from the present method.

The first step, depicted in block A, includes providing a wafer processed with a plurality of optical benches in a wafer (a silicon wafer in the case of the optical assembly of FIG. 1). During wafer processing, the wafer is preferably coated with a layer of photoresist in order to protect the wafer from contamination or damage during a subsequent dicing operation. The wafer processing creates the retaining cavity, the metalized region within the cavity (layer of aluminum), the metalized regions, and the mounting pads of each of the silicon optical benches. The wafer may be processed using conventional well known methods.

The next step, shown in block B, involves separating the wafer into individual silicon optical benches. Wafer separation may be accomplished with conventional well known dicing methods. One such method involves sawing along streets defining the edges of the optical benches with a diamond-tipped, water-cooled precision micro-saw. The separation process of block B cuts through the silicon wafer and may produce a cloud of silicon dust particles which can contaminate an unprotected wafer. The silicon dust cloud is particularly troublesome with respect to the retaining cavities because the silicon dust particles are difficult to remove from the cavities. The layer of photoresist prevents the silicon dust particles from entering the cavities during dicing.

Block C of the method involves stripping the photoresist from the individual optical bench dies. Non-electrolytic solvents such as acetone are preferred for this step of the method because they do not cause electrochemically induced corrosion of the aluminum layer. Electrolytic solvents cause the layer of aluminum in the retaining cavity to corrode, because aluminum is anodic relative to the gold, platinum, titanium, and tin used in other metalized regions of the silicon optical bench. The anodic oxidation forms an excessive amount of aluminum oxide on the surface of the aluminum. Similar electrochemical corrosion may occur with other dissimilar metallizations such as tungsten and aluminum or copper and aluminum. The excessive aluminum oxide thickness will weaken the aluminum oxide bonds formed at the optical element/aluminum layer interfaces during aluminum oxide bonding. Aluminum oxide bonds only form if the silicon dioxide on the surface of the optical element contacts the layer of aluminum on the surface of the cavity. A thick layer of aluminum oxide on the surface of the aluminum will substantially prevent the necessary contact.

Block D of the method includes the step of rinsing the optical bench dies in an etchant solution. A preferred etchant includes a solution of potassium hydroxide (KOH). The KOH rinse substantially removes any aluminum oxide and other contaminants (silicon dust produced by dicing without the use of a protective photoresist layer) from the surface of the aluminum layer in the cavity. A 0.053 molar solution of KOH and a rinse time of approximately 50 seconds are preferably used in the method for KOH rinsing. Shorter rinse times and/or more concentrated KOH solutions or, longer rinse times and/or less concentrated KOH solutions, may also be used in other embodiments of the method. The exact rinse time and/or KOH solution concentration will depend upon the extent of corrosion and the characteristics of the metal or metals on the substrate.

In block E of the method, silicon dioxide coated optical elements are bonded in the cavities of the optical bench dies using an aluminum oxide bonding method. This step is accomplished by placing the optical element into the aluminum coated cavity of the optical bench die. A pressing tool heated to about 350° C. is then pressed against the optical element for approximately five (5) to thirty (30) seconds with a pressing force of approximately 0.2–1.0 grams per micron length of the optical element. The heat and pressure generated by the pressing tool forms aluminum oxide bonds at each area where the optical element and the cavity contact each other. It should be understood that the exact parameters of the aluminum oxide bonding method will depend upon the type of optical element to be bonded.

After the optical elements are bonded to the optical bench dies, the laser chip and photodiode components are attached and electrically connected to the metalized regions via the mounting pads to form the optical subassembly shown in FIG. 1.

The method of the present invention produces aluminum oxide bonds that provide optical element shear strengths of between 120 and 200 grams as measured by industry standard methods. These shear strengths substantially exceed the 20–30 gram standard which has been established for reasonably assuring that the optical element/die bond will not fail during normal use.

It is understood that the above-described embodiment illustrates only one of the many possible specific embodiments which can represent applications of the principles of the invention. For example, where non-electrolytic photoresist stripping solvents are ineffective, electrolytic solvents such as isopropyl alcohol, can be used for stripping the photoresist after dicing. Although electrolytic solvents increase the thickness of the aluminum oxide formed on the surface of the aluminum layer, the method substantially reduces or removes the excess aluminum oxide from the aluminum. This and other numerous modifications and changes can be made by those skilled in the art without departing from the spirit and scope of the invention.

What is claimed is:

1. A method of bonding an optical element having an oxide outer surface to a support substrate comprising the steps of:

providing the substrate;

forming on the substrate a metallized region for metal-oxide bonding of the optical element, the metallized region including metal oxide on the surface;

etching the metallized region with an alkali etchant to remove metal oxide on the metallized region; and bonding the optical element on the etched metallized region by the application of heat and pressure to effect metal-oxide bonding.

2. The method according to claim 1, wherein said etchant solution includes potassium hydroxide.

3. The method according to claim 2, wherein said step of rinsing has a duration of up to fifty seconds.

4. The method according to claim 2, wherein said step of rinsing is performed at room temperature.

5. The method according to claim 1, wherein said metalized region comprises a layer of aluminum.

6. The method according to claim 1, wherein said supporting substrate further includes a cavity for retaining an optical element, said metalized region disposed on a surface of said cavity.

7. The method according to claim 6, wherein said supporting substrate includes a second metalized region comprised of a plurality of metallic layers.

* * * * *